United States Patent

Higashi

[11] Patent Number: 6,157,581
[45] Date of Patent: Dec. 5, 2000

[54] SEMICONDUCTOR MEMORY HAVING A RESTORE VOLTAGE CONTROL CIRCUIT

[75] Inventor: Tetsunori Higashi, Tokyo, Japan

[73] Assignee: NEC Corporation, Tokyo, Japan

[21] Appl. No.: 09/372,518

[22] Filed: Aug. 11, 1999

[30] Foreign Application Priority Data

Aug. 12, 1998 [JP] Japan .................................. 10-228059

[51] Int. Cl.⁷ .................................................. G11C 7/08
[52] U.S. Cl. ................ 365/189.11; 365/189.09; 365/205; 365/190; 365/228; 365/189.07
[58] Field of Search .................... 365/189.09, 189.11, 365/205, 190, 226, 228, 189.07

[56] References Cited

U.S. PATENT DOCUMENTS

| | | | |
|---|---|---|---|
| 4,870,620 | 9/1989 | Yamagata et al. | 365/222 |
| 5,128,863 | 7/1992 | Nakamura et al. | 463/44 |
| 5,986,474 | 11/1999 | Chung et al. | 326/86 |

*Primary Examiner*—Andrew Q. Tran
*Attorney, Agent, or Firm*—Darryl G. Walker

[57] ABSTRACT

According to disclosed embodiments, a semiconductor memory (100) can include a restore voltage control circuit (106) that can supply a first internal voltage $V_{INT}$ that is lower than an external power supply voltage Vcc, a second internal voltage $V_{INTS}1$ that is lower than the first internal voltage $V_{INT}$, and a third internal voltage $V_{INT}2$ equal to or less than the first internal voltage $V_{INT}$ and greater than the second internal voltage $V_{INTS}1$. The semiconductor memory (100) can further include a p-channel MOS transistor (T108) that can provide a conductive path between a voltage supply path (116) and a sense amplifier (104) in response to a sense signal Se at the first internal voltage $V_{INT}$. A switch signal generating circuit (112) can supply a switch signal Sw that can change the potential on the voltage supply path (116) from the second internal voltage $V_{INTS}1$ to the third internal voltage $V_{INTS}2$ while transistor T108 is conductive.

20 Claims, 5 Drawing Sheets

SEMICONDUCTOR MEMORY HAVING A RESTORE VOLTAGE CONTROL CIRCUIT

TECHNICAL FIELD

The present invention relates generally to a semiconductor memory (such as a DRAM) that includes dynamic memory cells, and more particularly to restore voltage control circuits that can supply a restore voltage to the bit line pair of a selected memory cell.

BACKGROUND OF THE INVENTION

FIG. 4 is a schematic diagram showing a configuration of a conventional semiconductor memory. The conventional semiconductor memory is designated by the general reference character 400, and can include a memory cell array 402, a sense amplifier 404, and a restore voltage control circuit 406. An external power supply voltage Vcc is also supplied to the semiconductor memory 400.

The memory cell array 402 can comprise a number of memory cells (not shown), each having an n-channel MOS transistor that can include a gate, a source, and a drain. The transistors can be arranged in a matrix and located at intersections between a plurality of word lines and a plurality of bit line pairs.

The sense amplifier 404 can not only read contents stored in a memory cell of the memory cell array 402, but can also restore the stored contents of the memory cell. The restore voltage control circuit 406 can supply a read voltage and a restore voltage to the sense amplifier 404.

The sense amplifier 404 can include p-channel metal-oxide-semiconductor (PMOS) transistors T400 and T402 that can be conceptualized as a differential pair; n-channel MOS (NMOS) transistors T404 and T406 that can be conceptualized as an active load; a PMOS transistor T408 that can control a connection between a common source signal line SAP and an external power supply Vcc; and an NMOS transistor T410 that can control a connection between a common source signal line SAN and an external power supply $V_{SS}$.

The sense amplifier 404 can further include a connection node LI that can connect the drains of PMOS transistor T400 and NMOS transistor T404 to one another, and further to a bit line 408, and a connection node L2 that can connect the drains of PMOS transistors T402 and NMOS transistor T406 to one another, and further to a bit line 410. The gates of NMOS transistor T406 and PMOS transistor T402 can be coupled to connection node L1. The gates of NMOS transistor T404 and PMOS transistor T400 can be coupled to connection node L2.

Bit lines 408 and 410 can be connected to the current paths of NMOS transistors corresponding to the memory cells arranged in the memory cell array 402.

NMOS transistor T410 can have a drain connected to the common source signal line SAN, a source coupled to the Vss power supply ("grounded"), and a gate coupled to a sense signal SENSE through inverters 412-*b* and 412-*c*.

The common source signal line SAP can be connected to the external power supply Vcc through PMOS transistor T408. Transistor T408 can have a back gate (or "body") connected to its source and a gate that receives a switch signal SWITCH through an inverter 414. A switch signal SWITCH can be generated by a switch signal generating circuit (not shown).

The output of the restore voltage control circuit 406 can be connected to the common source signal line SAP through a PMOS transistor T412. Transistor T412 can have a back gate coupled to its source and a gate that receives the sense signal SENSE through inverter 412-*a*. The sense signal SENSE can be generated by a sense signal generating circuit (not shown).

The restore voltage control circuit 406 can include a comparator circuit 416 and a PMOS transistor T414. A reference voltage Vref, that is lower than the external supply voltage Vcc, can be supplied to the comparator circuit 416. The reference voltage Vref can be generated by a reference voltage generating circuit (not shown). PMOS transistor T414 can have a source connected to the external power supply Vcc, a drain connected to the input of comparator circuit 416 and a gate connected to the output of comparator circuit 416.

FIG. 5 is a timing diagram illustrating a restore operation of the conventional semiconductor memory of FIG. 4. At first, a "boot" voltage Vboot, that is higher than the external power supply voltage (Vcc) can be applied to a word line. The word line can correspond to the gate of an NMOS transistor of a memory cell on which a restore operation is to be performed. The response of a "booted" word line is shown by waveform 500.

The application of the Vboot voltage can result in the potential of the memory cell appearing on a bit line. The response of a bit line is shown by waveform 502. Waveform 504 illustrates the response of the other bit line of a bit line pair that includes the bit line illustrated by waveform 502. The level of the bit line illustrated by waveform 504 is shown to go to zero.

Based on the external power supply voltage Vcc and the reference voltage Vref, the restore voltage control circuit 406 can generate an internal voltage $N_{INTS}$ that can be equal to the reference voltage Vref. The sense signal SENSE can then transition high. This transition is shown by waveform 506. The high sense signal SENSE value can be inverted by inverter 412-*a* and applied to the gate of PMOS transistor T412. The high sense signal SENSE can be further driven by inverters 412-*b* and 412-*c* and applied to the gate of NMOS transistor T410. In this way, PMOS transistor T412 and NMOS transistor T410 can be placed in an "on" state. Thus, the internal voltage $N_{INTS}$ from the restore voltage control circuit 406 can be supplied to the common source signal line SAP of sense amplifier 404. This is illustrated by waveform 508 of FIG. 5.

When the internal voltage $N_{INTS}$ is supplied to the sense amplifier 404, sensing of the bit line levels by the sense amplifier 404 can start. A switch signal SWITCH can then transition high. The high switch signal SWITCH can be inverted by inverter 414 and applied to the gate of PMOS transistor T408, turning on transistor T408. As a result, the external power supply voltage Vcc can be supplied to the common source signal line SAP instead of the internal voltage $V_{INTS}$. The sensing of the bit line level can thereby be accelerated as shown by waveforms 502 and 504. The storage contents of a memory cell (a "1" or a "0") can be read out according to the level sense states of the bit lines (shown by waveforms 502 and 504).

When the switch signal SWITCH returns low, PMOS transistor T408 can be turned off, terminating the supply of the external power supply voltage Vcc to the sense amplifier 404. Instead, the internal voltage $N_{INTS}$ is once again supplied to the sense amplifier 404. In this way, restoration of a data value, which has been accelerated by the external power supply voltage Vcc, can be completed with the internal voltage $V_{INTS}$.

In recent years, semiconductor memory devices have included sense amplifiers and memory cell arrays that can operate at an internal voltage that is less than an external power supply voltage. Sense amplifiers and memory cell arrays of this type can have improved operating speeds, as the overall size of the device ("chip") can be scaled down by utilizing fine bit lines (bit lines with smaller line widths) and/or reductions in the threshold voltage of MOS transistors.

A drawback to such semiconductor memory devices having lower internal voltages, is that the restore voltage control circuit (such as that show as item 406 in FIG. 4) can be undesirable in such devices. The application of an external power supply voltage to reduced operating voltage sense amplifiers and/or memory cell arrays can result in "latch-up" or other adverse consequences.

SUMMARY OF THE INVENTION

In light of the above described circumstances, it is one object of the present invention to provide a semiconductor memory having a sense amplifier and a memory cell array that can be operated at a voltage lower than an external power supply voltage. Such a sense amplifier and memory cell array can have improved operating speeds due to a scaled down chip size. Such reductions in chip size can be achieved with fine bit lines and/or reductions in transistor threshold voltage.

In order to achieve the above-described object, a semiconductor memory according to one embodiment of the invention can include a plurality of word lines, a plurality of bit lines, and a plurality of memory cells arranged into a matrix, with a memory cell being situated at the intersection of a word line and bit line. One or more voltages to read stored contents of a memory cell, and one or more voltages to restore the contents of a memory cell that has been read, can be supplied onto bit line pairs.

The memory can further include a voltage supply means for supplying a first internal voltage that is lower than an external power supply voltage, a second internal voltage that is lower than the first internal voltage, and a third internal voltage equal to or lower than the first internal voltage and higher than the second internal voltage.

A switch means can also be included that can provide a conductive path between a first node and the sense amplifier when the first internal voltage is supplied.

A change-over means can also be included that can supply the second internal voltage onto the first node, and subsequently change over from the second internal voltage to the third internal voltage while the switch means provides the conductive path.

In a semiconductor memory according to one embodiment of the present invention, a memory device can include a sense amplifier and a memory cell array in a reduced size chip and/or a sense amplifier and memory cell array having improved operating speeds. The sense amplifier and memory cell array can operate using first, second, and third internal voltages that are lower than an external power supply voltage. Such an arrangement can have a more stable restore operation, as the external power supply voltage is not directly used to restore data values. Thus, variances in the external voltage, such as an alternating current (AC) type voltage, may not adversely effect a restore operation.

According to one aspect of the embodiments, a preferred voltage supply means can include a reference voltage generating circuit and a restore voltage control circuit. The reference voltage generating circuit can generate first and second reference voltages.

A restore voltage control circuit can receive the first and second reference voltages and the external power supply voltage. In response to these voltages, the restore voltage control circuit can supply a voltage output that is equal to the first reference voltage as the second internal voltage and a voltage output that is equal to the second reference voltage as the third internal voltage. Such an arrangement can have a simple circuit construction.

According to another aspect of the embodiments, a semiconductor memory can preferably also include a switch signal generating circuit. The switch signal generating circuit can supply switch signal output that can make one of the first and second reference voltages effective in the restore voltage control circuit. The switch signal generating circuit can also constitute the change-over means. In such an arrangement, the change-over means can be realized by a comparatively simple circuit construction.

According to another aspect of the embodiments, it is preferable that the change-over means, after switching from the second internal voltage to the third internal voltage, switches back to the second internal voltage according to a predetermined timing.

DETAILED DESCRIPTION OF THE EMBODIMENTS

Figure 1:
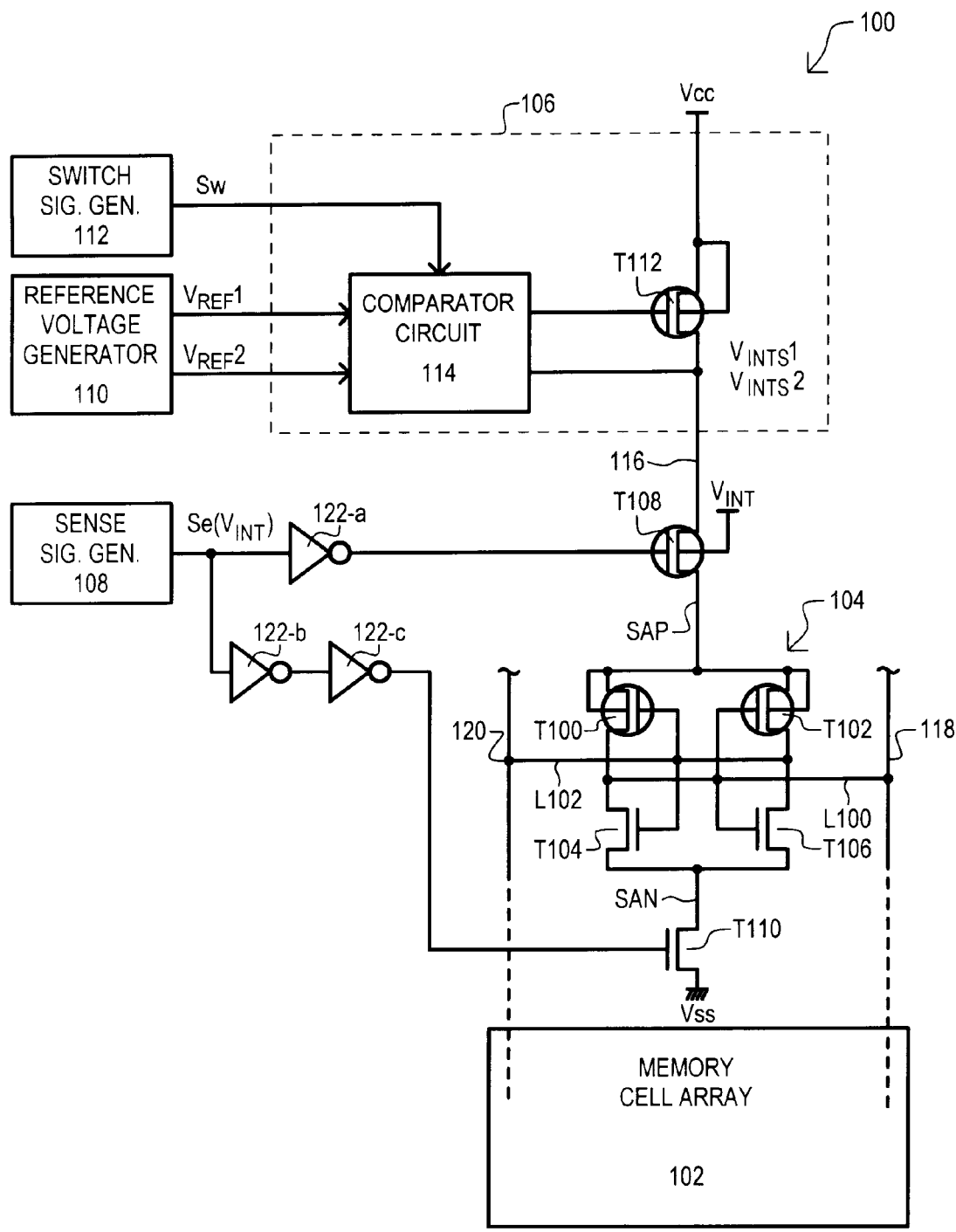
FIG. 1 is a schematic diagram of a semiconductor memory according to one embodiment.

The present invention will now be further described with reference to a number of drawings. FIG. 1 is a schematic diagram of a semiconductor memory according to one embodiment of the present invention.

The semiconductor memory is designated by the general reference character 100 and can include a memory cell array 102, a sense amplifier 104, and a restore voltage control circuit 106. Within the memory cell array 102 and sense amplifier 104, a bit line can be narrower than a conventional case, allowing the integrated circuit device ("chip") size to be scaled down. In addition, the threshold voltage of n-channel devices within a p-well can be set lower than a conventional case, allowing such devices to operate at a supply level that is lower than an external supply voltage (Vcc). Such narrower bit lines and lower threshold devices can improve operating speeds.

The memory cell array 102 can include a plurality of memory cells (not shown), each of which can have an n-channel insulated gate field effect transistor (IGFET). Such transistors will be referred to herein by a particular example of an IGFET, the metal-oxidesemiconductor (MOS) transistor. The memory cell n-channel MOS (NMOS) transistors can include a gate, a source and a drain, and can be arranged in a matrix at the intersections of word lines and bit line pairs.

The sense amplifier 104 can read the storage contents of a selected memory cell, and can also restore the storage contents of the memory cell. The restore voltage control circuit 106 can supply voltages for read and restore operations in the sense amplifier 104.

The semiconductor memory 100 can further include a sense signal generating circuit 108, a reference voltage generating circuit 110, and a switch signal generating circuit 112.

The sense signal generating circuit 108 can generate a sense signal Se that can be driven to a first internal voltage $V_{INT}$.

The reference voltage generating circuit 110 can supply a reference voltage $V_{REF}1$ that can be used to generate a second internal voltage $V_{INTS}1$, and a reference voltage $V_{REF}2$ that can be used to generate a third internal voltage $V_{INTS}2$. The reference voltages $V_{REF}1$ and $V_{REF}2$ can be supplied to a comparator circuit 114 of the restore voltage control circuit 106.

The switch signal generating circuit 112 can generate a switch signal Sw that can be driven to the first internal voltage $V_{INT}$. The switch signal Sw can make one of the reference voltages $V_{REF}1$ and $V_{REF}2$ effective in the restore voltage control circuit 106. The switch signal Sw can be supplied to the comparator circuit 114.

The first internal voltage $V_{INT}$ can be lower than the external power supply voltage Vcc. The second internal voltage $V_{INTS}1$ can be lower than the first internal voltage $V_{INT}$. The third internal voltage $V_{INT}2$ can be equal to or lower than the first internal voltage $V_{INT}$, and higher than the second internal voltage $V_{INT}1$. In the embodiment, as just one example, the external power supply voltage Vcc) can be set to about 3.3V, the first internal voltage $V_{INT}$ can be about 2.9V, the second internal voltage $V_{INTS}1$ can be about 2.2V, and the third internal voltage $V_{INTS}2$ can be set within the range of about 2.2V to about 2.9V.

The sense amplifier 104 can include p-channel MOS (PMOS) transistors T100 and T102, that can constitute a differential pair, NMOS transistors T104 and T106 which can constitute active loads, PMOS transistor T108, and an NMOS transistor T110. NMOS transistor T110 can control the connection of a common source signal line SAN and a power supply voltage Vss. PMOS transistor T108 can control the connection of a common source signal line SAP and a voltage supply path (a first node) 116. Transistor T108 can constitute a switch means that forms a conductive path between voltage supply path 116 and sense amplifier 104 in response to a low signal being driven on its gate.

One skilled in the art would recognize that PMOS transistor T108 can provide a controllable impedance path between the common source signal line SAP and the voltage supply path 116. Such a controllable impedance path can be controlled by the sense signal Se. Of course, other structures could be utilized to provide such an impedance path.

The sources of PMOS transistors T100 and T102 can be commonly connected to the common source signal line SAP. The sources of NMOS transistors T104 and T106 can be commonly connected to the common source signal line SAN. A connection node L100 can connect the drains of PMOS transistor T100 and NMOS transistor T104, and can also be connected to a bit line 118. A connection node L102 can connect the drains of PMOS transistor T102 and NMOS transistor T106, and can also be connected to a bit line 120.

The gates of PMOS transistor T102 and NMOS transistor T106 can be connected to connection node L100. The gates of PMOS transistor T100 and NMOS transistor T104 can be connected to connection node L102.

Bit lines 118 and 120 can be connected to current paths of NMOS transistors corresponding to the plurality of memory cells arranged in the memory cell array 102.

NMOS transistor T110 can have a drain connected to the common source signal line SAN, a source that is grounded (connected to power supply voltage VSS), and a gate connected to the output of sense signal generating circuit 108 through inverters 122-b and 122-c.

PMOS transistor T108 can have a drain connected to the common source signal line SAP and a source that is connected to the output (voltage supply path 116) of the restore voltage control circuit 106. The output of the sense signal generating circuit 108 can be connected to the gate of PMOS transistor T108 through an inverter 122-a. PMOS transistor can thus be turned off and on in response to level changes in the sense signal Se provided by the sense signal generating circuit 108.

The restore voltage control circuit 106 can include comparator circuit 114 and a PMOS transistor T112. The reference voltages $V_{REF}1$ and $V_{REF}2$ can be supplied to the comparator circuit 114 from the reference voltage generating circuit 110. A switch signal Sw can also be supplied to the comparator circuit 114 from the switch signal generating circuit 112.

One skilled in the art would recognize that PMOS transistor T112 can provide a controllable impedance path between the external power supply Vcc and the voltage supply path 116. Such a controllable impedance path can be controlled by the switch signal Sw and reference voltages ($V_{REF}1$ and $V_{REF}2$). The impedance of the controllable impedance path provided by PMOS transistor T112 can be adjusted to provide various internal voltages that are less than the external power supply voltage Vcc.

Figure 2:
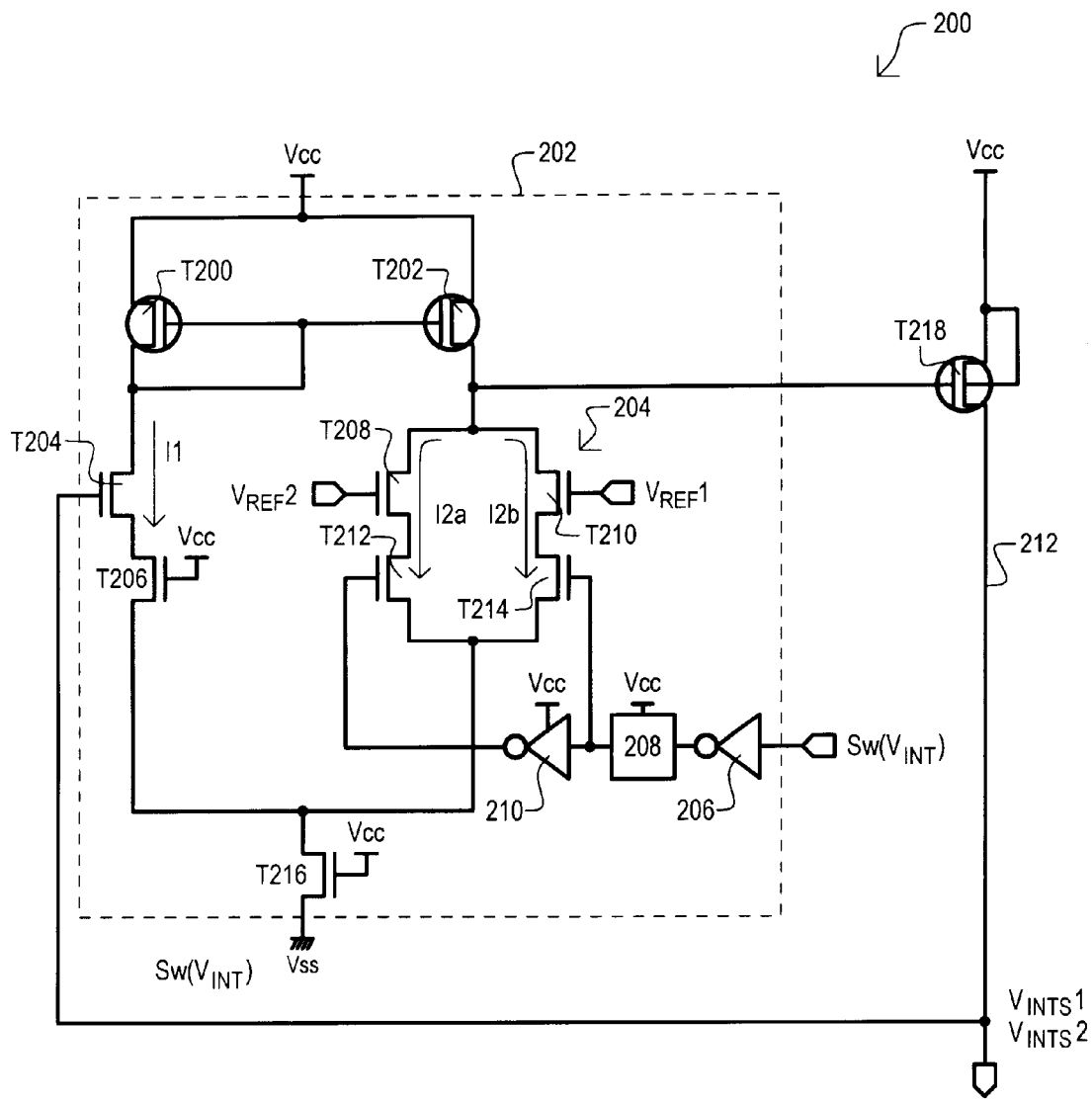
FIG. 2 is a schematic diagram of a restore voltage control circuit according to one embodiment.

FIG. 2 is a schematic diagram of a restore voltage control circuit according to one embodiment. The restore voltage control circuit is designated by the general reference character 200, and can be utilized as the restore voltage control circuit shown as item 106 in FIG. 1.

The restore voltage control circuit 200 can include a comparator circuit 202 that includes PMOS transistors T200 and T202 having sources that are connected to an external power supply Vcc. PMOS transistors T200 and T202 can have matching characteristics. The comparator circuit 202 can further include an NMOS transistor T204 having a drain connected to the drain of PMOS transistor T200. The gates of PMOS transistors T200 and T202 can be connected to the drain of NMOS transistor T204, and can constitute a current mirror circuit.

One skilled in the art would recognize that such a current mirror circuit can include a first current path that includes the source-drain path of PMOS transistor T200 and a second current path that includes the source-drain path of PMOS transistor T202.

The comparator circuit can further include an NMOS transistor T206 and a change-over circuit 204. NMOS transistor T206 can have a drain connected to the source of NMOS transistor T204 and a gate connected to external power supply voltage Vcc. Change-over circuit 204 can be connected to the drain of PMOS transistor T202.

The change-over circuit 204 can include a NMOS transistors T208 and T210 having sources commonly connected to the drain of PMOS transistor T202, an NMOS transistor T212 having a drain coupled to the source of NMOS transistor T208, and an NMOS transistor T214 having a drain coupled to the source of NMOS transistor T210. NMOS transistors T208 to T214 can have matching characteristics.

Reference voltage $V_{REF}1$ can be supplied to the gate of NMOS transistor T210 from a reference voltage generating circuit (such as 110). Reference voltage $V_{REF}2$ can be supplied to the gate of NMOS transistor T208 from a reference voltage generating circuit (such as 110).

A switch signal Sw, that can transition to a first internal voltage $V_{INT}$, can be supplied to the gate of NMOS transistor T214 through an inverter 206 and a voltage converting circuit 208. The switch signal Sw can also be supplied to the gate of NMOS transistor T212 through an inverter 210. The voltage converting circuit 208 can convert a signal that transitions to the internal voltage $V_{INT}$ to a signal that can transition to the external power supply voltage Vcc.

The source of NMOS transistor T206 and the drain of an NMOS transistor T216 can be commonly connected to the sources of NMOS transistors T212 and T214. Transistor T216 can include a source that is grounded (connected to the external power supply Vss) and a gate that is connected to the external power supply Vcc.

A PMOS transistor T218 of the restore voltage control circuit 200 can correspond to PMOS transistor T112 in FIG. 1. PMOS transistor T218 can have a source and back gate (body) connected to external power supply Vcc. The drain of PMOS transistor T218 can be connected the input of comparator circuit 202 (the gate of NMOS transistor T204). The gate of PMOS transistor T218 can be connected to the output of comparator circuit 202 (the drain of PMOS transistor T202).

In the restore voltage control circuit 200, as one example, when the switching signal switches to a low level, a state can be entered in which the reference voltage $V_{REF}1$ is effective. The gate of NMOS transistor T214 can receive a high level through inverter 206 and voltage converting circuit 208, and the gate of NMOS transistor T212 can receive a low level through inverter 206, voltage converting circuit 208, and inverter 210. NMOS transistor T214 can be turned on and NMOS transistor T212 can be turned off. In this arrangement, the reference voltage $V_{REF}1$ that is supplied to the gate of NMOS transistor T210 is made effective.

When the reference voltage $V_{REF}1$ is effective, a current I2b, corresponding to reference voltage $V_{REF}1$, can flow through current paths in NMOS transistors T210 and T214. In this case, since PMOS transistors T200 and T202 constitute a current mirror circuit, a current I1 flowing through transistor T204 can be equal to the I2b current. A potential at the gate of NMOS transistor T204, which can be the potential of a voltage supply path 212, can become equal to the reference voltage $V_{REF}1$.

Looked at in another way, the restore voltage control circuit 200 can supply a voltage output as the second internal voltage $V_{INTS}1$ that is equal to the reference voltage $V_{REF}1$, based upon the reference voltage $V_{REF}1$ and external power supply voltage Vcc. The restore voltage control circuit 200 can also supply a voltage output as the third internal voltage $V_{INTS}2$ that is equal to the reference voltage $V_{REF}2$, based upon the reference voltage $V_{REF}2$ and external power supply voltage Vcc.

Therefore, when the switch signal is changed over to a high level, the change-over circuit 204 is changed to a state that can be conceptualized as the inverse of the above described state. Reference voltage $V_{REF}2$ can become effective, and the current I2a, corresponding to reference voltage $V_{REF}2$, can flow through transistors T208 and T212. In this way, the potential of gate of NMOS transistor T204, that is the potential of voltage supply path 212, can become equal to reference voltage $V_{REF}2$.

Figure 3:
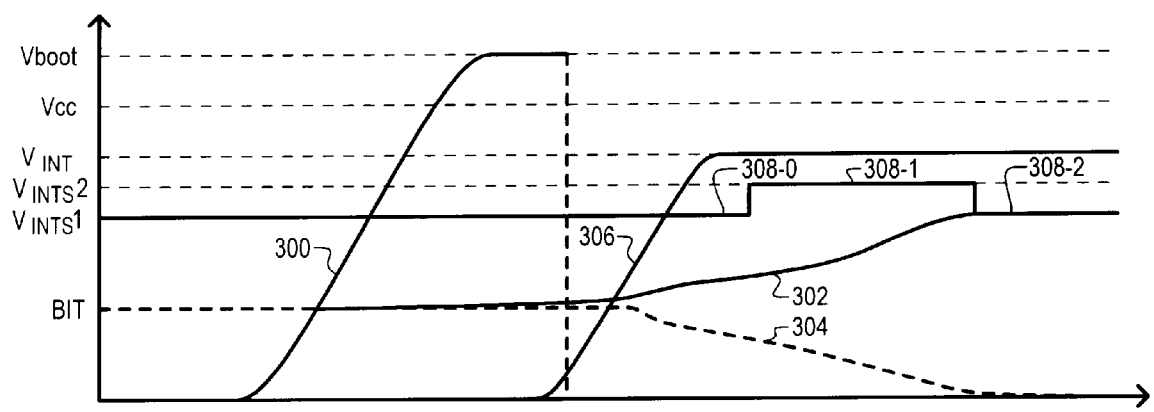
FIG. 3 is a timing diagram illustrating the operation of an embodiment.
Figure 4:
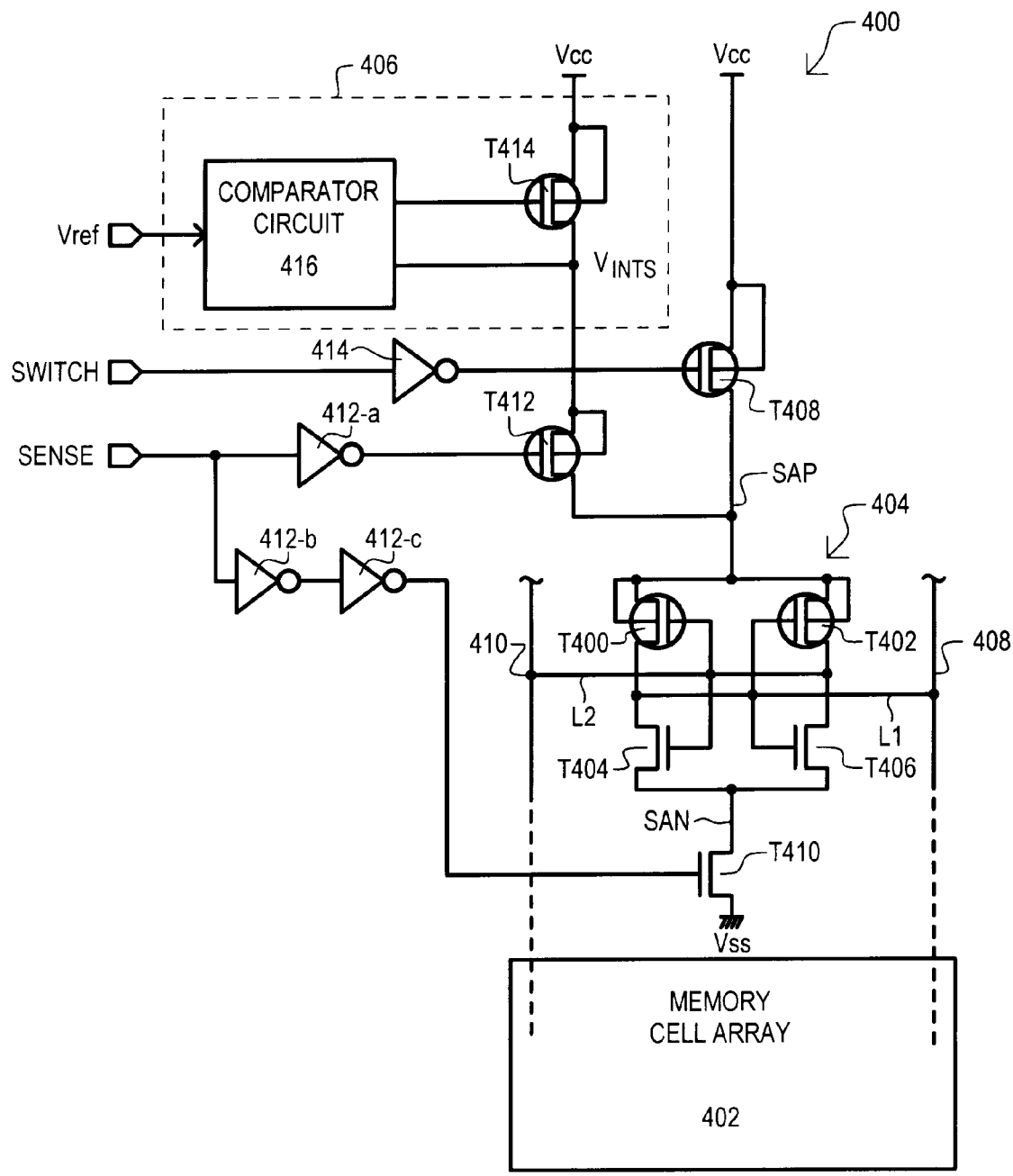
FIG. 4 is a schematic diagram of a conventional semiconductor memory.
Figure 5:
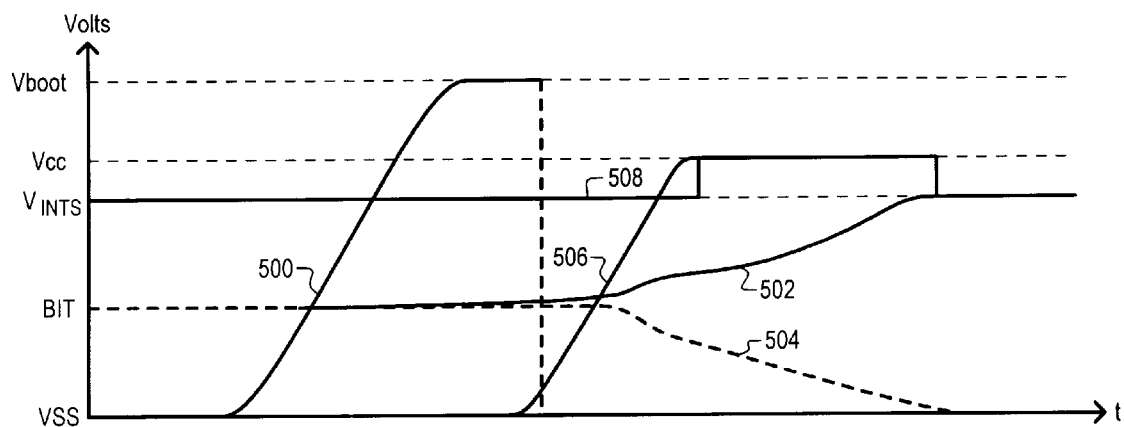
FIG. 5 is a timing diagram illustrating the operation of the conventional semiconductor memory of FIG. 4.

FIG. 3 is a timing diagram illustrating a restore operation of a semiconductor memory according to one embodiment. The operation will be described with reference to FIGS. 1 and 3.

At first, a "boot" voltage Vboot, that is higher than an external power supply voltage Vcc, can be applied to a word line (shown as waveform 300). The word line can be coupled to the gate of an NMOS transistor of a memory cell (not shown) on which a restore operation is to be performed. The response of a bit line pair is illustrated by waveforms 302 and 304.

At this point, in the restore voltage control circuit 106, the voltage supply path 116 can assume the second internal voltage $V_{INTS}1$ level by the change over of the switch signal Sw to the low level. The sense signal Se of the first internal voltage $V_{INT}$ level can transition high. This is illustrated by waveform 306 in FIG. 3. As a result, a low level can be applied to the gate of PMOS transistor T108 and a high level can be applied to the gate of NMOS transistor T110, according to predetermined timing. PMOS transistor T108 and NMOS transistor T110 can be turned on, and the voltage supply path 116 can become conductive. In this way, the second internal voltage $V_{INTS}1$ can be supplied to the common source signal line SAP from the restore voltage control circuit 106. This is illustrated by the waveform portion 308-0 of FIG. 3.

Sensing of the a bit line level by sense amplifier 104 can begin by the second internal voltage $V_{INTS}1$ being supplied to the sense amplifier 104. The switch signal Sw, then can transition to the first internal voltage level $V_{INT}$, can change to the high level according to predetermined timing. With the switch signal Sw high, the voltage supply path 116 can assume the third internal voltage $V_{INTS}2$ level. At this point, since PMOS transistor T108 is kept in the on state by the sense signal Se being at the high level, the third internal voltage $V_{INTS}2$ can be supplied to the common source signal line SAP instead of the second internal voltage. This is illustrated by the waveform portion 308-1 of FIG. 3. The sensing of a bit line (shown by waveform 302) can thus be accelerated, which in turn, can accelerate the voltage change of the other bit line (shown by waveform 304). It is understood that the contents of a memory cell, such as a "1" or a "0" can be read according to the levels of the bit line pairs (waveforms 302 and 304).

Then, the switch signal Sw can change over to a low level according to predetermined timing. The voltage supply path 116 can thus assume the second internal voltage $V_{INTS}1$ level. Since the second internal voltage $V_{INTS}1$ is again supplied to the sense amplifier 104 through PMOS transistor T108, which is in an on state, the restore operation that has been accelerated by the third internal voltage $V_{INTS}2$ can be completed with the second internal voltage $V_{NTS}1$.

In a semiconductor memory 100 such as that described above, the sense amplifier 104 can be operated at a second internal voltage $V_{NTS}1$ or a third internal voltage $V_{INTS}2$, while PMOS transistor T108 can be operated by a signal at the first internal voltage $V_{INT}$. Thus, adverse conditions in the external power supply voltage Vcc, such as an alternating current (AC) voltage, can be prevented from affecting a restore operation. Further, a sense amplifier 104 and memory cell array 102 can have narrow bit lines and improved operating speeds due to reduced transistor threshold voltages. These circuits can be properly operated by first through third internal voltages that can be lower than the external power supply voltage Vcc.

In a semiconductor memory 100, such as that described above, a high level voltage is not applied to the sense amplifier 104 and the memory cell array 102, with the exception of a boot voltage Vboot, that is higher than the external power supply voltage Vcc. The boot voltage Vboot can be applied to a word line corresponding to the gate of an NMOS transistor of a memory cell. Therefore, an external power supply voltage or higher is not applied to the sense amplifier 104 and memory cell array 102, and situations can be avoided where overcurrent can flow to a substrate and breakdown of a device due to latch-up can occur.

While FIG. 3 sets forth an example where the third internal voltage $V_{INTS}2$ is lower than the first internal voltage $V_{INT}$, a similar effect as that of the described embodiments may be achieved even if the third internal voltage $V_{INTS}2$ is set to the level of the first internal voltage $V_{INT}$.

As described above, according to the present invention, a semiconductor memory can have a sense amplifier and a memory cell array having improved operating speeds. Such a semiconductor memory can have a scaled down chip size by utilizing fine bit lines and/or reductions in transistor threshold voltages. Such lower threshold devices can be operated at voltages lower than an external power supply voltage.

While the present invention has been described based on a preferred embodiment above, it is understood that such particular embodiments should not be construed as limiting the present invention thereto. Semiconductor memories having various modifications and changes to the embodiment are included within the scope of the present invention.

Further, one skilled in the art would recognize that other devices other than memories that can employ sense amplifiers, or the like, could employ the present invention. Such devices can include reduced threshold transistors and lower-than-power-supply internal voltages for sensing small data signals. In addition, while the particular disclosed embodiments utilize reference voltages to control an impedance device (such as transistor T112) and thereby generate internal voltages, other arrangements could be employed. If a reference voltage generator 110 can provide sufficient current to drive a sense amplifier (or group of sense amplifiers), reference voltages (such as $V_{REF}1$ and $V_{REF}2$) could be switched directly to a node (such as SAP).

Accordingly, while various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. In a semiconductor memory that includes a plurality of memory cells arranged into matrix, the memory cells being situated at the vicinity of intersections of word lines and at least one bit line, and a sense amplifier that can receive voltages to read storage contents of a memory cell and restore storage contents from a memory cell that have been supplied to a bit line pair, the semiconductor memory comprising:

voltage supply means for supplying a first internal voltage that is lower than an external power supply voltage, a second internal voltage that is lower than the first internal voltage, and a third internal voltage that can have a value in a range from the second internal voltage to the first internal voltage;

switch means for providing a conductive path between a first node and the sense amplifier in response to a sense signal of the first internal voltage;

change-over means for supplying the second internal voltage to the first node and subsequently changing the potential at the first node to the third internal voltage while the switch means provides the conductive path.

2. The semiconductor memory of claim 1, wherein:

the voltage supply means comprises
      a reference voltage generating circuit for generating first and second reference voltages, and
      a restore voltage control circuit for supplying a voltage output equal to the first reference voltage as the second internal voltage when the first reference voltage is made effective and supplying a voltage output equal to the second reference voltage as the third internal voltage when the second reference voltage is made effective.

3. The semiconductor memory of claim 2, further including:

a switch signal generating circuit for supplying a switch signal output, the switch output making the first reference voltage effective in one state and the second reference voltage effective in another state.

4. The semiconductor memory of claim 2, wherein:

the change-over means subsequently changes the potential at the first node back to the second internal voltage after changing the potential at the first node to the third internal voltage, according to a predetermined timing.

5. A semiconductor memory, comprising:

a voltage supply path;

a sense amplifier;

a sense controllable impedance path coupled between the voltage supply path and the sense amplifier, the sense controllable impedance path being controlled according to a sense signal input; and a restore voltage control circuit having at least one supply controllable impedance path controlled by a switch signal input that provides a first internal voltage to the voltage supply path when the switch signal input has a first value and a second internal voltage to the voltage supply path when the switch signal input has a second value, the first and second internal voltages being less than an external power supply voltage.

6. The semiconductor memory of claim 5, wherein:

the sense amplifier includes matching differential insulated gate field effect transistors (IGFETs) having sources coupled to the voltage supply path.

7. The semiconductor memory of claim 5, wherein:

the sense controllable impedance path can include a sense IGFET having a source-drain path coupled between the voltage supply path and the sense amplifier.

8. The semiconductor memory of claim 7, wherein:

the sense IGFET is a p-channel IGFET.

9. The semiconductor memory of claim 5, wherein:

the restore voltage control circuit further includes a change-over circuit having
      a first change-over current path that can provide a first change-over current that varies according to a first reference voltage, the first change-over current path being enabled when the switch signal input has the first value, and
      a second change-over current path that can provide a second change-over current that varies according to a second reference voltage, the second change-over current path being enabled when the switch signal input has the second value.

10. The semiconductor memory of claim 9, wherein:

the first change-over current path includes a first change-over IGFET having a source-drain path in series with the source-drain path of a second change-over IGFET, the gate of the first change-over IGFET being coupled to the first reference voltage, and the gate of the second change-over IGFET being coupled to the switch signal.

11. The semiconductor memory of claim 10, wherein:

the second change-over current path includes a third change-over IGFET having a source-drain path in series with a source-drain path of a fourth change-over IGFET, the source-drain paths of the third and fourth change-over IGFETs being arranged in parallel with the source-drain paths of the first and second change-over IGFETs, the gate of the third change-over IGFET being coupled to the second reference voltage, and the gate of the fourth change-over IGFET being coupled to the switch signal.

12. The semiconductor memory of claim 11, wherein:

the switch signal can transition to a third internal voltage, the third internal voltage being greater than the first internal voltage, the switch signal being coupled to the gate of the second change-over IGFET by a voltage converting circuit that can drive the gate of the second change-over IGFET to a voltage greater than the third internal voltage, and the switch signal being coupled to the gate of the fourth change-over IGFET by at least one inverter.

13. An integrated circuit that can receive a power supply voltage, comprising:

a sense amplifier having a sense amplifier supply node;

a voltage supply path that can transition from a first internal voltage to a second internal voltage, the first and second internal voltages being less than the power supply voltage; and a sense controllable impedance path coupled between the sense amplifier supply node and the voltage supply path.

14. The integrated circuit of claim 13, wherein:

the second internal voltage is greater than the first internal voltage.

15. The integrated circuit of claim 13, further including:

a restore voltage control circuit coupled to the voltage supply path that can generate the first internal voltage and the second internal voltage.

16. The integrated circuit of claim 15, wherein:

the restore voltage control circuit includes a switch controllable impedance path between an external power supply node and the sense controllable impedance path, the switch controllable impedance path being controlled by at least one reference voltage.

17. The integrated circuit of claim 16, wherein:

the switch controllable impedance path is controlled by a first reference voltage and a second reference voltage.

18. The integrated circuit of claim 16, wherein:

the restore voltage control circuit includes a current mirror having a first current mirror path and a second current mirror path, the first current mirror path including a first change-over current path having an impedance that can be controlled by a first reference voltage, and a second change-over current path having an impedance that can be controlled by a second reference voltage.

19. The integrated circuit of claim 18, wherein:

the first change-over current path is enabled by a switch signal, and the second change-over current path is enabled by an inverse switch signal.

20. The integrated circuit of claim 18, wherein:

the restore voltage control circuit includes the switch controllable impedance path between the external power supply node and the sense controllable impedance path, the switch controllable impedance path having a control node coupled to one of the current mirror paths.

* * * * *